(12) United States Patent
Dorscheid et al.

(10) Patent No.: US 7,326,934 B2
(45) Date of Patent: Feb. 5, 2008

(54) DETECTOR FOR THE DETECTION OF ELECTROMAGNETIC RADIATION

(75) Inventors: Ralf Dorscheid, Kerkrade (NL); Petra Graetz, Birkwitz (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 603 days.

(21) Appl. No.: 10/023,168

(22) Filed: Dec. 18, 2001

(65) Prior Publication Data

US 2002/0079459 A1 Jun. 27, 2002

(30) Foreign Application Priority Data

Dec. 21, 2000 (DE) ............... 100 63 907

(51) Int. Cl.
  G01T 1/20 (2006.01)
  H01L 21/02 (2006.01)
(52) U.S. Cl. ................. 250/370.11; 438/118
(58) Field of Classification Search ........... 438/64, 438/65, 69, 118; 257/53, 431; 250/370.11
See application file for complete search history.

(56) References Cited

U.S. PATENT DOCUMENTS

| | | | |
|---|---|---|---|
| 5,506,409 A * | 4/1996 | Yoshida et al. ........ 250/370.11 |
| 5,770,706 A * | 6/1998 | Wu et al. ............... 523/429 |
| 5,831,269 A * | 11/1998 | Nakamura et al. ..... 250/370.11 |
| 5,965,893 A * | 10/1999 | Tonami et al. ......... 250/370.11 |
| 6,063,688 A * | 5/2000 | Doyle et al. ............ 438/424 |
| 6,080,979 A * | 6/2000 | Sklebitz et al. ......... 257/431 |
| 6,103,551 A * | 8/2000 | Ono et al. .............. 438/118 |
| 6,149,748 A * | 11/2000 | Boedinger et al. ..... 250/370.11 |
| 6,265,782 B1 * | 7/2001 | Yamamoto et al. ..... 257/783 |
| 6,292,528 B1 * | 9/2001 | Wieczorek et al. ..... 250/370.09 |
| 6,362,481 B1 * | 3/2002 | Warren ................ 250/370.11 |
| 6,420,213 B1 * | 7/2002 | Nakajyo et al. ........ 438/118 |
| 6,452,186 B1 * | 9/2002 | Wieczorek et al. ..... 250/370.11 |
| 6,469,305 B2 * | 10/2002 | Takabayashi et al. .. 250/370.11 |
| 6,528,796 B1 * | 3/2003 | Kaifu et al. ........... 250/370.11 |
| 2002/0070343 A1 * | 6/2002 | Hoffman ............... 250/367 |

FOREIGN PATENT DOCUMENTS

JP 406331749 A * 12/1994 ........... 250/370.11
JP 09054162 A 2/1997

* cited by examiner

Primary Examiner—G. Bradley Bennett

(57) ABSTRACT

The invention relates to a detector for the detection of electromagnetic radiation, which detector includes at least one scintillator (6), at least one CMOS chip (3) and a ceramic basic element (4), a respective intermediate layer (2) that is free from bubbles and defined in respect of its gap width being provided each time between the scintillator (6) and the CMOS chip (3) and between the CMOS chip (3) and the ceramic basic element (4), the intermediate layer (2) containing at least two adhesives (A, B) of different consistency and spacers (5).

20 Claims, 1 Drawing Sheet

DETECTOR FOR THE DETECTION OF ELECTROMAGNETIC RADIATION

BACKGROUND OF THE INVENTION

The invention relates to a detector for the detection of electromagnetic radiation, which detector includes at least one scintillator, at least one CMOS chip and one ceramic basic element, a respective intermediate layer being provided each time between the scintillator and the CMOS chip and between the CMOS chip and the ceramic basic element. Further aspects of the invention concern the manufacture of such a bubble-free intermediate layer and the manufacture of a detector that is provided with such an intermediate layer.

Detectors of this kind are used to convert, for example, X-rays into radiation in the visible range, for example, in X-ray examination apparatus.

Detectors for, for example, X-ray examination apparatus are customarily constructed in combination with scintillators, CMOS chips and a ceramic basic element where the light emitted by the scintillator is then detected by the photosensor device that is provided on the CMOS chip.

The uniformity of the gap width of the intermediate layer between the scintillator and the CMOS chip has a significant effect on the detection accuracy of the detector and hence on the overall image quality of the X-ray examination apparatus. Air inclusions in the intermediate layer have a negative effect on the detection accuracy of the detector.

JP 09054162 A discloses an X-ray detector in which a transparent intermediate layer that consists of a cured adhesive is provided between the region of the scintillator and the region of the photosensors.

The gap width of the intermediate layer is determined by a spacer. In particular, an adhesive tape is used to enhance the uniformity of the gap width. In a preferred embodiment of the invention, the region of the scintillator and the region of the photosensors are positioned so as to extend perpendicularly to one another and the adhesive is introduced from above while utilizing the capillary effect and the force of gravity, a spacer being provided at the lower end of the gap. Such positioning at right angles is very complex from a point of view of technical industrial manufacture, because manufacturing processes of this kind often are economically carried out in the horizontal plane. When an adhesive tape is provided at the lower end of the gap as described above, the capillary effect that is necessary for complete introduction is partly limited so that the desired complete expulsion of air is not possible. Capillary forces can regularly be encountered only in open systems where this occurs only conditionally at the lower end of the gap in the described arrangement. The handling of the described spacer also presents a problem, that is, notably the application of an adhesive tape in an environment with dimensions in the μm range.

SUMMARY OF THE INVENTION

It is an object of the invention to realize a detector that is provided with one or more intermediate layers that achieve a high degree of uniformity of the gap width and can be manufactured in large numbers at acceptable costs. It is also an object of the invention to provide methods of manufacturing the intermediate layers and of industrially manufacturing detectors at acceptable costs while utilizing the methods.

The object is achieved in that the detector for the detection of electromagnetic radiation consists of at least one scintillator, at least one CMOS chip and one ceramic basic element, that a respective intermediate layer that is defined in respect of its gap width is arranged each time between the scintillator and the CMOS chip and between the CMOS chip and the ceramic basic element, and that the intermediate layer contains at least two adhesives (A, B) of different consistency.

The detector, being used notably as an X-ray detector or as a detector for computed tomography apparatus (CT apparatus), includes an intermediate layer that is realized notably as an adhesive. The use of an adhesive for the intermediate layers ensures that reliable bonds are obtained that are mechanically and thermally stable.

The desired defined gap width of the intermediate layer is obtained notably by the appropriate choice of the spacers. Spacers in the sense of the invention are components that serve exclusively for realizing the desired spacing, for example wires, or components that are otherwise functionally necessary and whose dimension may have been chosen especially for this purpose, for example, bumps that are present on the CMOS chip. The desired respective gap width can be simply realized by an appropriate choice of the dimensions of the spacer. Use is preferably made of a commercially available wire having a circular cross-section. Wires of this kind can be readily purchased at low costs and in standard sizes of from 15 to 75 μm in the preferred materials such as Au and AlSil. On the other hand, the bumps can be realized by customary methods so as to take into account the desired height, thus enabling technologically simple realization of the desired dimensional accuracy. The spacers or the bonding points for the adhesive (A) are preferably provided in areas that do not essentially influence the function of the detector, for example, in optically inactive regions on the CMOS chip. No additional surface area is required for the placement and use of very small quantities of the adhesive (A), the main objective of the use of the adhesive (A) being achieved nevertheless. This adhesive serves for the fast fixation of the desired uniform gap width while utilizing a minimum amount of materials for this purpose.

Commercially available epoxy resin, cyanoacrylate or acrylate adhesives that can be easily applied and cured quickly can be used as the adhesive (A) for this application in accordance with the invention.

The adhesive (A1) is electrically conductive so as to enable dissipation of charges from the rear of the CMOS chip.

In order to achieve an as small as possible gap width, at least some quantities of the adhesive (A1), notably on the adhesive points, are applied directly to the rear surfaces of the CMOS chip as well as to the ceramic basic element. In that case a plurality of spacers are arranged directly between the surfaces of the CMOS chip and the ceramic basic element, that is notably without quantities of the adhesive (A1) coming into contact therewith.

Furthermore, at least some quantities of the adhesive (A2) are applied to the surface of the scintillator as well as to the bumps present on the CMOS chip.

The adhesive (B) in accordance with the invention is a low-viscosity 2-component adhesive, preferably on an epoxy resin basis, that has a refractive index >1.5 and enables low-loss transmission of light in the wavelength range of from 450 to 550 nm. This adhesive (B), providing the major part of the adhesive force in the intermediate layer, does not age significantly under the influence of electromagnetic irradiation, that is, not even over prolonged periods of time. Suitable flow behavior is required notably so as to ensure reliable filling that is complete and free from bubbles. The curing of the adhesive (B) can be advantageously adapted to the thermal loadability of the contact partner.

The object of the invention is also achieved by a method of forming an intermediate layer between a CMOS chip and a ceramic basic element, where spacers and quantities of an adhesive (A1) are applied to the surface of the ceramic basic element during the first step, where the applied quantities of an adhesive (A1) project from the spacers, where subsequently the CMOS chip is placed on the quantities and is bonded and fixed while resting on the spacers and quantities of the adhesive (A1), and where during a second step the gap remaining between the CMOS chip and a ceramic basic element is completely filled with an adhesive (B) which is applied to a side of the CMOS chip in the horizontal position and enters the gap under the influence of capillary forces and is subsequently allowed to cure.

The object of the invention is also achieved by a method of forming an intermediate layer between a scintillator and a CMOS chip, where at least quantities of an adhesive (A2) are applied, during the first step, to the bumps that are provided in optically inactive regions of the CMOS chip surface, after which the scintillator is arranged on the bumps and is bonded and fixed while resting on the bumps and on the quantities of the adhesive (A2), and where in a second step the gap remaining between the scintillator and the CMOS chip is completely filled with an adhesive (B) which is applied to a side of the scintillator in the horizontal position and enters the gap under the influence of capillary forces and is subsequently allowed to cure.

The invention also relates to an X-ray examination apparatus which includes at least one detector for the detection of electromagnetic radiation, at least one scintillator, at least one CMOS chip and one ceramic basic element, a respective intermediate layer that is defined in respect of its gap width being applied each time between the scintillator and the CMOS chip and between the CMOS chip and the ceramic basic element, the intermediate layer containing at least two adhesives (A, B) of different consistency and spacers.

BRIEF DESCRIPTION OF THE DRAWINGS

Embodiments of the invention will be described in detail hereinafter with reference to the drawing. Therein.

DETAILED DESCRIPTION OF THE PRESENTLY PREFERRED EMBODIMENT

Figure 1:
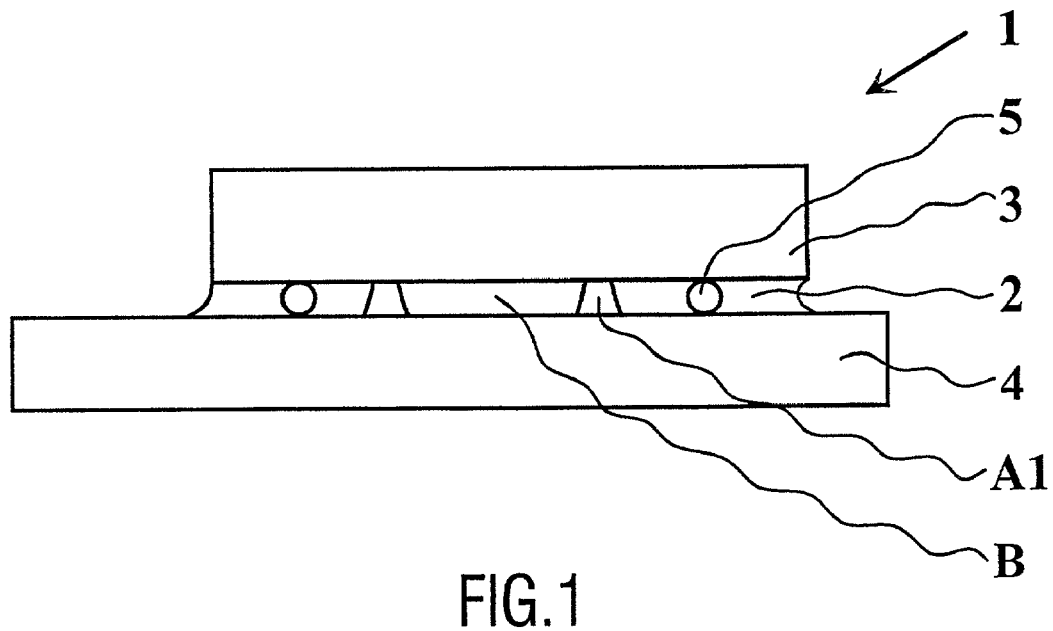
FIG. 1 is a diagrammatic side elevation of a part of a detector 1 with an intermediate layer 2 provided between a CMOS chip 3 and a ceramic basic element 4.

FIG. 1 shows a part of a detector 1 that is provided with an intermediate layer 2 between a CMOS chip 3 and a ceramic basic element 4 after completion of the execution of the method of manufacturing an intermediate layer of this kind. This result is achieved by the following steps that form part of an industrial manufacturing process.

Spacers 5 that in this case consist of Au and have a diameter of 30 μm are arranged on the surface of the ceramic basic material 4, consisting of a bondable material such as AgPt, by a customary standard technique. Adjacent these two wires, extending parallel to the direction of flow of the adhesive (B), four quantities of the adhesive (A1) are deposited, without contacting the wires, the adhesive in this case being a conductive 2-component epoxy resin adhesive that cures comparatively quickly, the deposition being performed by a commercially available dispenser. The quantities of the adhesive (A1) are droplets that project approximately 40 μm from the surface of the ceramic basic element 4. The CMOS chip 3 is moved to the desired, accurately defined position over the ceramic basic element 4 so as to be positioned horizontally by a semi-automatic positioning device that notably utilizes customary measuring and positioning means and data techniques.

After the positioning, where the CMOS chip 3 first contacts the surface of the droplets of the adhesive (A1), the CMOS chip 3 will bear on the spacers 5 only under the influence of the force of gravity. The droplets of the adhesive (A1), then being in contact with the ceramic basic element 4 as well as with the CMOS chip 3, are cured in this position.

After the curing, preferably under the influence of heat as can take place in a Flip Chip Bonder, the desired and accurately defined gap with a gap width of approximately 30 μm will have been realized in a mechanically stable manner.

Subsequently, the adhesive (B) is introduced laterally and without bubbles into the gap by a dispenser, that is, from one side of the CMOS chip 3 only; the entire assembly, that is, notably the components of the intermediate layer 2 of the CMOS chip 3 and the ceramic basic element 4 has been heated to 80° C. in advance. The adhesive (B), whose viscosity is adapted to the required flow behavior, completely fills the gap (without air inclusions) under the influence of capillary forces. The adhesive (B) forms a respective meniscus at the other three openings of the gap, but does not emanate therefrom itself. Because of their small dimensions, the cured droplets of the adhesive (A1) that are present in the gap and the spacers do not have a significant effect on the flow behavior and on the formation of air inclusions. After the curing of the adhesive (B) while applying small amounts of heat, that is, 60° C. for approximately 2.5 hours, there will be obtained a stable intermediate layer 2 that ensures the necessary long-term stability.

Figure 2:
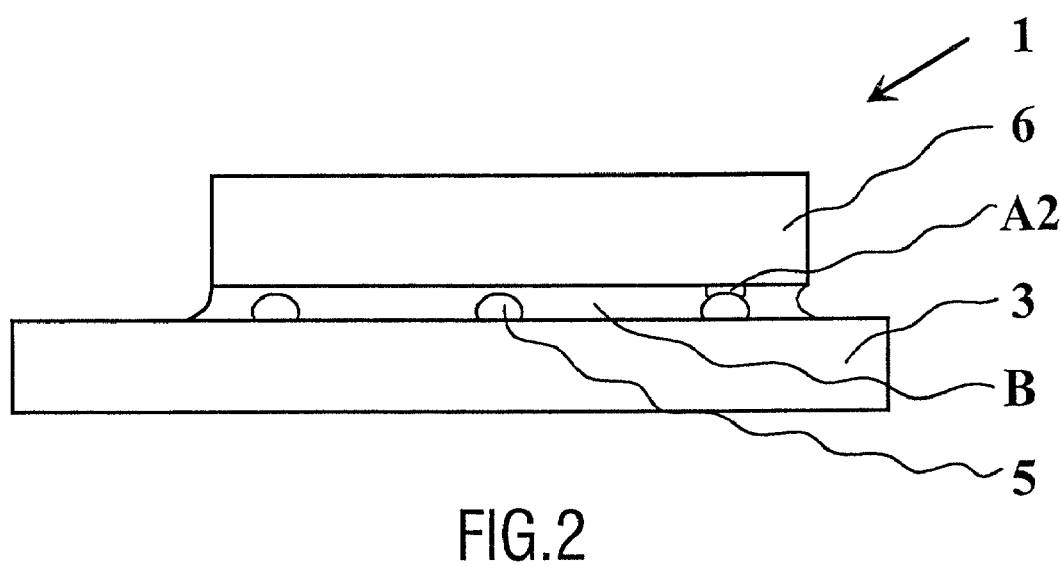
FIG. 2 is a diagrammatic side elevation of a part of a detector 1 with an intermediate layer 2 provided between a scintillator 6 and a CMOS chip 3.

FIG. 2 shows a part of a detector 1 that includes an intermediate layer 2 that is present between a CMOS chip 3 and a scintillator 6 after completion of the execution of the method for forming an intermediate layer 2 of this kind. This result is obtained by the following steps that form part of an industrial manufacturing process.

In optically inactive regions on the CMOS chip 3 there are provided spacers 5 that have a height of approximately 30 μm; they are referred to as bumps and in this case are made of NiAu. Using customary techniques, these bumps are accurately proportioned in respect of height so as to achieve the desired height of the gap of the intermediate layer 2. Droplets of the adhesive (A2) are applied only to the tips of individual bumps that regularly occupy a surface area of approximately 40×40 μm. The adhesive (A) is a comparatively fast curing adhesive that can be readily deposited by commercially available dispensers. The scintillator 6 is moved to the desired accurately defined position over the CMOS chip 3 so as to be positioned horizontally by a semi-automatic positioning device. After the positioning, where the scintillator 6 first contacts the surface of the droplets of the adhesive (A2), the scintillator 6 will bear horizontally on the spacers 5, that is, exclusively under the influence of gravity. The droplets of the adhesive (A2), then being in contact with the scintillator 6 as well as with the bumps, are cured in this position. After the curing, preferably under the influence of heat as can take place in the bonder, the desired and accurately defined gap with a gap width of approximately 30 µm will have been realized in a mechanically stable manner. Subsequently, the adhesive (B) is introduced laterally and without air bubbles into the gap by a dispenser, that is, from one side of the CMOS chip 3 only. The adhesive (B), whose viscosity is adapted to the required flow behavior, completely fills the gap (without air inclusions) under the influence of capillary forces. The adhesive (B) forms a respective meniscus at the other three sides of the gap, but does not emanate therefrom itself. Because of their small dimensions, the spacers 5 that are present in the gap do not have a significant effect on the flow behavior and on the formation of air inclusions. In the case of gap heights amounting to less than 50 µm, spacers 5 or cured quantities of the adhesive (A2) that occupy a surface area of more than 100×100 µm cannot be circumvented without giving rise to the risk of undesirable formation of air inclusions. After the curing of the adhesive (B) while applying small amounts of heat, that is, 60° C. for approximately 2.5 hours, there will be obtained a stable intermediate layer 2 that ensures the necessary long-term stability.

While the embodiments of the invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

The invention claimed is:

1. A detector for a detection of electromagnetic radiation, said detector comprising:
   at least one scintillator;
   at least one CMOS chip; and
   a ceramic basic element,
      wherein a respective intermediate layer that is defined in respect of its gap width is arranged each time between the scintillator and the CMOS chip and between the CMOS chip and the ceramic basic element, and
      wherein said intermediate layer contains at least two adhesives of different consistency and contained within separate portions, a first of said adhesives being a rapidly-curing adhesive to obtain a fast fixation of said gap width and a second of said adhesives being a low-viscosity adhesive to obtain a bubble-free intermediate layer, and spacers.

2. The detector as claimed in claim 1, wherein the gap width of the intermediate layer is determined by quantities of the first adhesive and a plurality of spacers.

3. The detector as claimed in claim 1, wherein the first adhesive is a fast curing epoxy resin, cyanoacrylate or acrylate adhesive.

4. The detector as claimed in claim 3, wherein at least some quantities of the first adhesive are applied directly to the surfaces of the CMOS chip and the ceramic basic element and that a plurality of spacers is arranged between the surfaces of the CMOS chip and the ceramic basic element.

5. The detector as claimed in claim 4, wherein each spacer is a wire spacer.

6. The detector as claimed in claim 3, wherein at least some quantities of the second adhesive are applied to the surface of the scintillator that faces the CMOS chip as well as to a plurality of bumps that are present on the CMOS chip.

7. The detector as claimed in claim 1, wherein the second adhesive is a low-viscosity adhesive, notably on an epoxy resin basis.

8. The detector as claimed in claim 1, wherein the ceramic basic element is based on an aluminum oxide.

9. An X-ray examination apparatus that includes at least one detector as claimed in claim 1.

10. The detector of claim 1, wherein the second of said adhesives has a refractive index greater than 1.5 and enables low-loss transmission of light in the wavelength range of 450 to 550 nm.

11. The detector of claim 1, wherein a portion of the first adhesive is applied to at least a portion of the spacers.

12. The detector of claim 11, wherein the portion of the first adhesive is applied to a surface of the portion of the spacers.

13. The detector of claim 12, wherein the portion of the first adhesive is applied only to tips of the spacers in at least one of the respective intermediate layers.

14. The detector of claim 1, wherein a portion of the first adhesive is applied without contacting at least a portion of the spacers.

15. The detector of claim 1, wherein the portion of the first adhesive is applied as droplets.

16. The detector of claim 15, wherein the droplets are applied to a droplet height that exceeds a height of spacers in the respective intermediate layer.

17. A detector for detecting electromagnetic radiation, said detector comprising:
   a ceramic basic element;
   a CMOS chip; and
   a first intermediate layer between said ceramic basic element and said CMOS chip, said first intermediate layer including
      a first spacer in contact with said ceramic basic element and said CMOS chip,
      a first adhesive adhered to said ceramic basic element and said CMOS chip, said first adhesive being a rapidly-curing adhesive to obtain a fast fixation of a gap width of the first intermediate layer, and
      a second adhesive adhered to said ceramic basic element and said CMOS chip, said second adhesive being a low-viscosity adhesive to obtain a bubble-free intermediate layer, wherein the first adhesive and the second adhesive form separate portions of adhesive.

18. The detector of claim 17,
   wherein said second adhesive is between and adhered to said first spacer and said first adhesive.

19. The detector for detecting electromagnetic radiation of claim 17, further comprising:
   a scintillator; and
   a second intermediate layer between said CMOS chip and said scintillator, said second intermediate layer including
      a second spacer in contact with said CMOS chip,
      a third adhesive adhered to said second spacer and said scintillator, and
      a fourth adhesive adhered to said CMOS chip, said scintillator, said second spacer and said third adhesive, wherein the third adhesive and the fourth adhesive form separate portions of adhesive.

20. The detector of claim 19,
   wherein said second intermediate layer further includes a third spacer in contact with said CMOS chip; and
   wherein said fourth adhesive is between and adhered to said scintillator and said third spacer.

* * * * *